United States Patent [19]

Byun et al.

[11] Patent Number: 5,712,181
[45] Date of Patent: Jan. 27, 1998

[54] METHOD FOR THE FORMATION OF POLYCIDE GATE IN SEMICONDUCTOR DEVICE

[75] Inventors: Jeong Soo Byun, Chungcheongbuk-do; Hyeong Joon Kim, Seoul, both of Rep. of Korea

[73] Assignee: LG Semicon Co., Ltd., Seoul, Rep. of Korea

[21] Appl. No.: 565,634

[22] Filed: Nov. 29, 1995

Related U.S. Application Data

[63] Continuation of Ser. No. 251,703, May 31, 1994, abandoned.

[30] Foreign Application Priority Data

Jul. 20, 1993 [KR] Rep. of Korea ............... 13692/1993

[51] Int. Cl.$^6$ .................................................. H01L 21/265
[52] U.S. Cl. .......................... 437/46; 437/40; 437/200; 437/41
[58] Field of Search ........................ 437/46, 41 GS, 437/40 GS, 41 TFT, 200, 192, 108, 109, 193, 20, 21

[56] References Cited

U.S. PATENT DOCUMENTS

| | | | |
|---|---|---|---|
| 4,950,617 | 8/1990 | Kumagai et al. | 437/44 |
| 4,978,629 | 12/1990 | Komori et al. | 437/41 |
| 5,030,584 | 7/1991 | Nakata | 437/193 |
| 5,081,066 | 1/1992 | Kim | 437/200 |
| 5,147,820 | 9/1992 | Chittipeddi et al. | 437/193 |
| 5,185,279 | 2/1993 | Ushiku | 437/46 |
| 5,278,096 | 1/1994 | Lee et al. | 437/193 |
| 5,279,976 | 1/1994 | Haden et al. | 437/44 |
| 5,298,436 | 3/1994 | Radosevich et al. | 437/29 |
| 5,321,286 | 6/1994 | Koyama et al. | 457/315 |
| 5,330,929 | 7/1994 | Pfiester et al. | 437/200 |
| 5,350,698 | 9/1994 | Huang et al. | 437/41 |
| 5,364,803 | 11/1994 | Lur et al. | 437/40 GS |
| 5,393,682 | 2/1995 | Liu | 437/101 |
| 5,393,687 | 2/1995 | Liang | 437/46 |
| 5,438,006 | 8/1995 | Chang et al. | 437/40 GS |
| 5,441,904 | 8/1995 | Kim et al. | 437/40 GS |

FOREIGN PATENT DOCUMENTS

| | | | |
|---|---|---|---|
| 2-77161(A) | 3/1990 | Japan | 437/46 |
| 4-100219(A) | 2/1992 | Japan | 437/46 |
| 4-206934(A) | 7/1992 | Japan | 437/46 |
| 5-109986(A) | 4/1993 | Japan | 437/46 |
| 5-144730(A) | 6/1993 | Japan | 437/46 |
| 6-132523(A) | 5/1994 | Japan | 437/46 |

OTHER PUBLICATIONS

Article Entitled "Junction Leakage Due to $CoSi_2$ Formation on As-Doped Polysilicon" by J.P. Gambino and B. Cunningham, Published Sep. 1993 in *J. Electrochem. Soc.*, vol. 140, pp. 2654-2658.

Article Entitled "High-Temperature Effects on a $Co-Si_2$/Poly-SI Metal Oxide Semiconductor Gate Configuration" by Stefan Nygren and Stefan Johansson, Published May/Jun. 1990 in *J. Vac. Sci. Technol.* A8(3), pp. 3011-3013.

*Primary Examiner*—George R. Fourson
*Assistant Examiner*—S. Mulpuri
*Attorney, Agent, or Firm*—Morgan, Lewis & Bockius LLP

[57] ABSTRACT

A method for the formation of gate in a semiconductor device is disclosed. The method for the formation of gate in a semiconductor device, comprising the steps of: forming amorphous silicon and polysilicon over a gate insulating film atop a semiconductor substrate, in due order; implanting impurity ions into the polysilicon and carrying out heat treatment; and forming a layer of a refractory metal over the silicon and carrying out heat treatment, to form polycide. Capable of preventing the degradation which is attributed to the penetration of impurities and thermal instability when forming a $P^+$ polygate, the method contribute to the improvement in electrical properties.

8 Claims, 7 Drawing Sheets

METHOD FOR THE FORMATION OF POLYCIDE GATE IN SEMICONDUCTOR DEVICE

This application is a continuation of application Ser. No. 08/251,703, filed May 31, 1994, now abandoned.

BACKGROUND OF THE INVENTION

The present invention relates, in general, to a method for fabrication a semiconductor device and, more particularly, to a method for forming a gate, capable of improving electrical properties.

In conventional methods for forming a gate of a hyperfine P-MOSFET, high density P type (P$^+$) polysilicon doped with B$^+$ or BF$_2^+$ is utilized, in order to prevent short channel effect.

The implantation of BF$_2^+$, which has been most widely carried out to form a shallow junction when P type junction is built, has an advantage of simplifying the formation processes for gate when it is utilized to dope polysilicon. However, the formation of gate by depositing a gate insulating film over a silicon substrate, depositing polysilicon doped with BF$_2^+$ and selectively etching the polysilicon cause the fluorine of BF$^{2+}$ to accelerate the penetration of boron into the silicon substrate and hence degrades the electrical properties of channel region.

In a gate formation method utilizing polycide, the polysilicon films over a source and drain region and a gate region can be formed into self-align silicide (hereinafter referred to as "salicide"), simultaneously at a step of forming silicide, and hence the processes can be simplified.

However, since this method utilizes a refractory metal, such as Ti and Co, in order to form the silicide of TiSi$_2$ or CoSi$_2$, there are some problems.

For example, in case of forming the silicide of TiSi$_2$, as reported in "Silicide-Silicon interface degradation during Ti/polysilicon oxidation" to M. Tanielian, R Lajos, and S. Blackstone, Electrochem. Soc., 132, 1456 (1985), the thickness of the silicide becomes nonuniform due to the fact that the silicon is nonuniformly exhausted (nonuniform silicide-silicon interface) when forming the silicide. In case of the latter, as disclosed in "Stability of polycrystalline Silicon-on-Cobalt Silicide-Silicon Structure" to S. P. Murada, C. C. Chang, A. C. Adams, J. Vac. Sci. Technol., B(5), 865(1987), since the lattice parameter of Co is similar to that of silicon, the phenomenon of recrystallization and grain growth reverse the order of a layer of silcide and a layer of polysilicon.

Accordingly, there is desperately required a novel method for the formation of gate in a semiconductor device, in order to solve the problems.

In order to better understand the background of the present invention, conventional methods for forming a gate in a semiconductor device are to be described with reference to figures.

Referring initially to FIGS. 1A through 1D, there is illustrated a conventional formation method for gate.

First, as illustrated in FIG. 1A, over a silicon substrate 1 is formed a gate insulating film 2 formed, on which a polysilicon 4 is then deposited.

Next, as illustrated in FIG. 1B, BF$_2^+$ ions are implanted entirely into the polysilicon 4 as indicated by arrows, and an annealing process is carried out to allow the polysilicon to have a columnar structure.

Thereafter, as illustrated in FIG. 1C, over the polysilicon 4, there is deposited Co 5, a refractory metal.

Finally, as illustrated in FIG. 1d, the result is annealed at about 900° C., to yield CoSi$_2$, and a selective etch process is carried out, to form a gate of semiconductor device.

Referring now to FIGS. 2A through 2D, there is illustrated another conventional formation method for gate.

First, as illustrated in FIG. 2A, over a silicon 11 is a gate insulating film 12 formed on which amorphous silicon 3 is then deposited.

Next as illustrated in FIG. 2B BF$_3^+$ ions are implanted entirely into the amorphous silicon 13 as indicated by arrows, and an annealing process is carried out to allow the amorphous silicon to have a recrystallization structure. As a result, the structure of this amorphous silicon is larger than that of the polysilicon employed in the previously mentioned method.

Thereafter, as illustrated in FIG. 1C, over the polysilicon 13, there is deposited Co 15, a refractory metal.

Finally, as illustrated in FIG. 1D, the resulting is annealed at about 900° C., to yield CoSi$_2$, and a selective etch process is carried out, to form a gate of semiconductor device.

Such conventional methods as are described above are problematic in the following aspects.

First, the columnar structure of the polysilicon causes the pipe-line diffusion of dopant along a grain boundary which is vertically formed on doping with the dopants.

Next, the recrystallization structure of the amorphous silicon also causes the penetration of dopant like the columnar structure.

In addition, after completing either of the conventional methods, the interface between CoSi$_2$ and Si is nonuniformly formed.

SUMMARY OF THE INVENTION

Therefore, an object of the present invention is to overcome the above problems encountered in prior arts and to provide a method for forming a gate in a semiconductor device, capable of restraining the penetration of impurities and providing thermal stability.

In accordance with the present invention, the above object of the present invention can be accomplished by providing a method for the formation of gate in a semiconductor device, comprising the steps of: forming amorphous silicon and polysilicon over a gate insulating film atop a semiconductor substrate, in due order; implanting impurity ions into the polysilicon and carrying out heat treatment; and forming a layer of a refractory metal over the silicon and carrying out heat treatment, to form polycide.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Hereinafter, the preferred embodiments of the present invention will be described with reference to the accompanying drawings.

Referring initially to FIG. 3, there is illustrated a method for the formation of gate in a semiconductor device, according to the present invention.

Figure 1A:
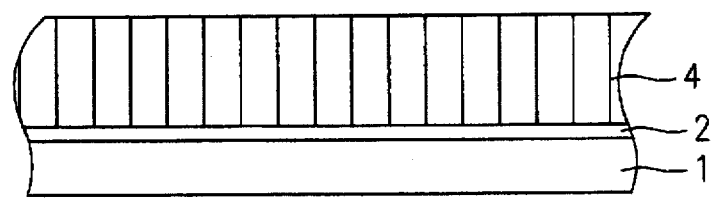
FIGS. 1A through 1D are schematic, cross sectional views illustrating a conventional method for forming a Gate in a semiconductor device.
Figure 1B:
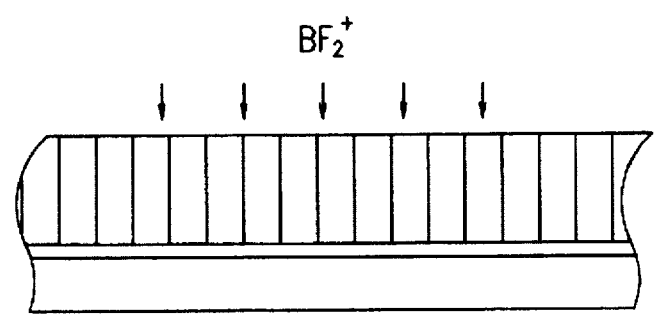
Figure 1C:
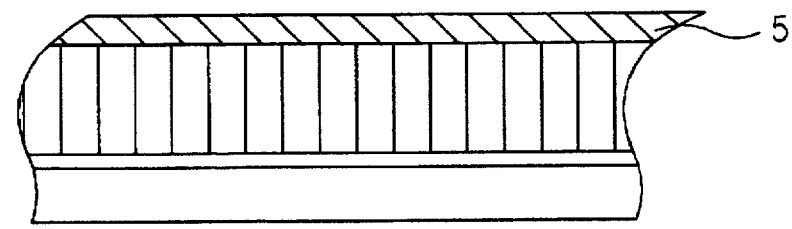
Figure 1D:
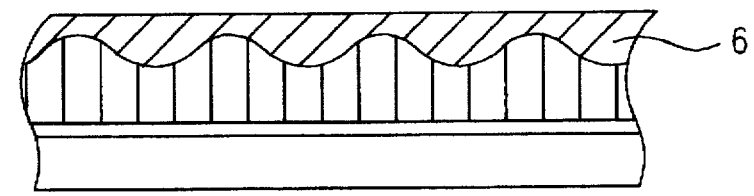
Figure 2A:
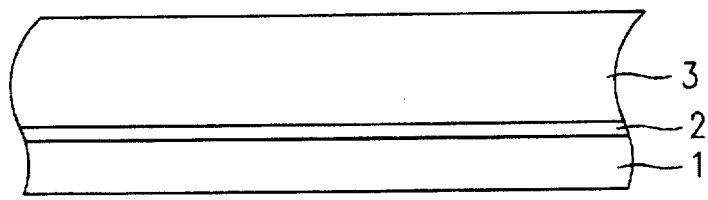
FIGS. 2A through 2D are schematic, cross sectional views illustrating another conventional method for forming a gate in a semiconductor device.
Figure 2B:
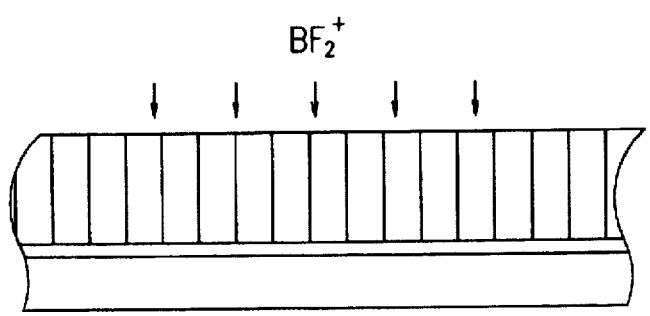
Figure 2C:
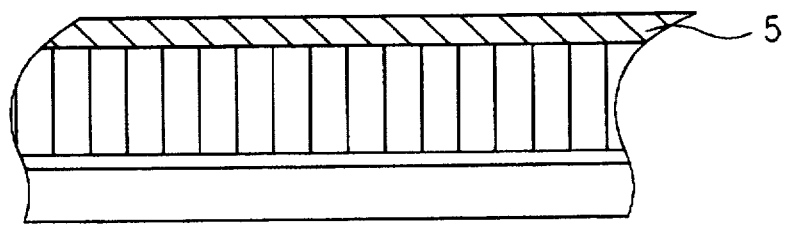
Figure 2D:
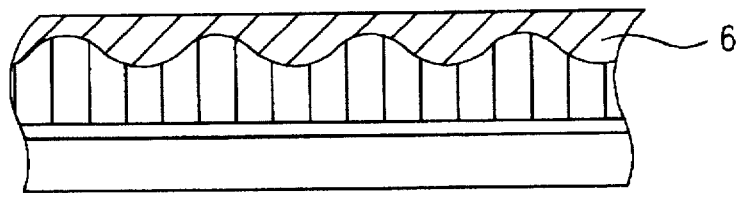
Figure 3A:
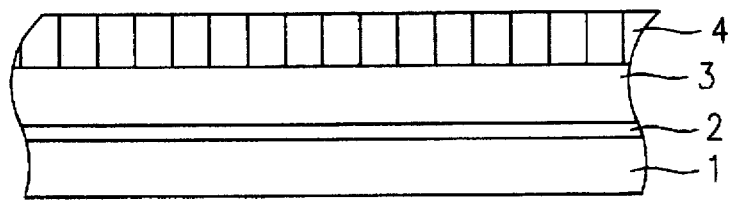
FIGS. 3A through 3D are schematic, cross sectional views illustrating a method for the formation of gate in a semiconductor device, according to the present invention.

First, as illustrated in FIG. 3A, over a silicon substrate 1, there is deposited $N_2O$, so as to form a gate insulating film which is 80 Å thick. It is also illustrated in this figure that amorphous silicon is 3 deposited on the gate insulating film, followed by the deposition of polysilicon on the amorphous silicon 3.

Figure 3B:
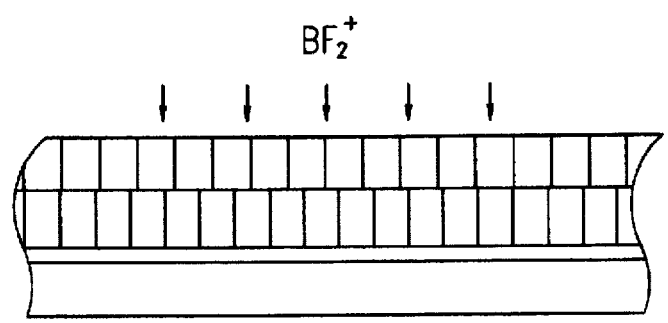

Subsequently, as illustrated in FIG. 3B, $BF_2^+$ ions are entirely implanted into the polysilicon, and an annealing process is carried out to form a horizontal grain boundary H between the amorphous silicon and the polysilicon, wherein the vertical grain boundaries formed in the amorphous silicon and the polysilicon are not connected with each other due. As a result of the disconnection, no penetration of dopants occurs. At the moment, the polysilicon 4 must have a thickness in which it is expected to be consumed when polycide is formed later.

Figure 3C:
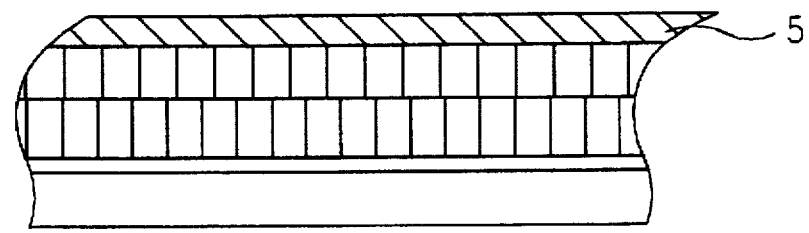

Thereafter, as illustrated in FIG. 3C, over the polysilicon 4 is Co 5, a refractory metal, deposited.

Figure 3D:
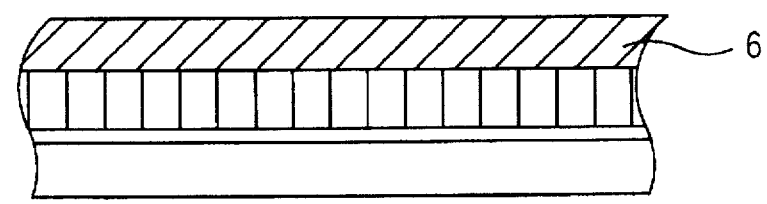

Finally, as illustrated in FIG. 3D, the resulting structure is subjected to heat processing. At this time, the polysilicon 4 and the Co 5 react, to form a uniform thickness of polycide 6, $CoSi_2$. A gate of semiconductor device can be completed by selectively etching the polycide 6 formed and the amorphous silicon 3.

This method according to the present invention takes advantages over the conventional methods, as follow.

First, since the $BF_2^+$ ion-implantation and subsequent annealing is carried out in back of the deposition of amorphous silicon and polysilicon over the silicon substrate, the gate of the present invention is much superior to the conventional ones in face resistance, that is, conductivity.

Second, the measurement of I-V characteristics after the formation of gate reveals that there are larger break down voltage and less leak current.

Third, the measurement of C-V characteristics after the formation of gate reveals that there is a better effect in electrical properties.

With regard to these effects, more detailed description will be given by referring to some drawings.

Figure 4:
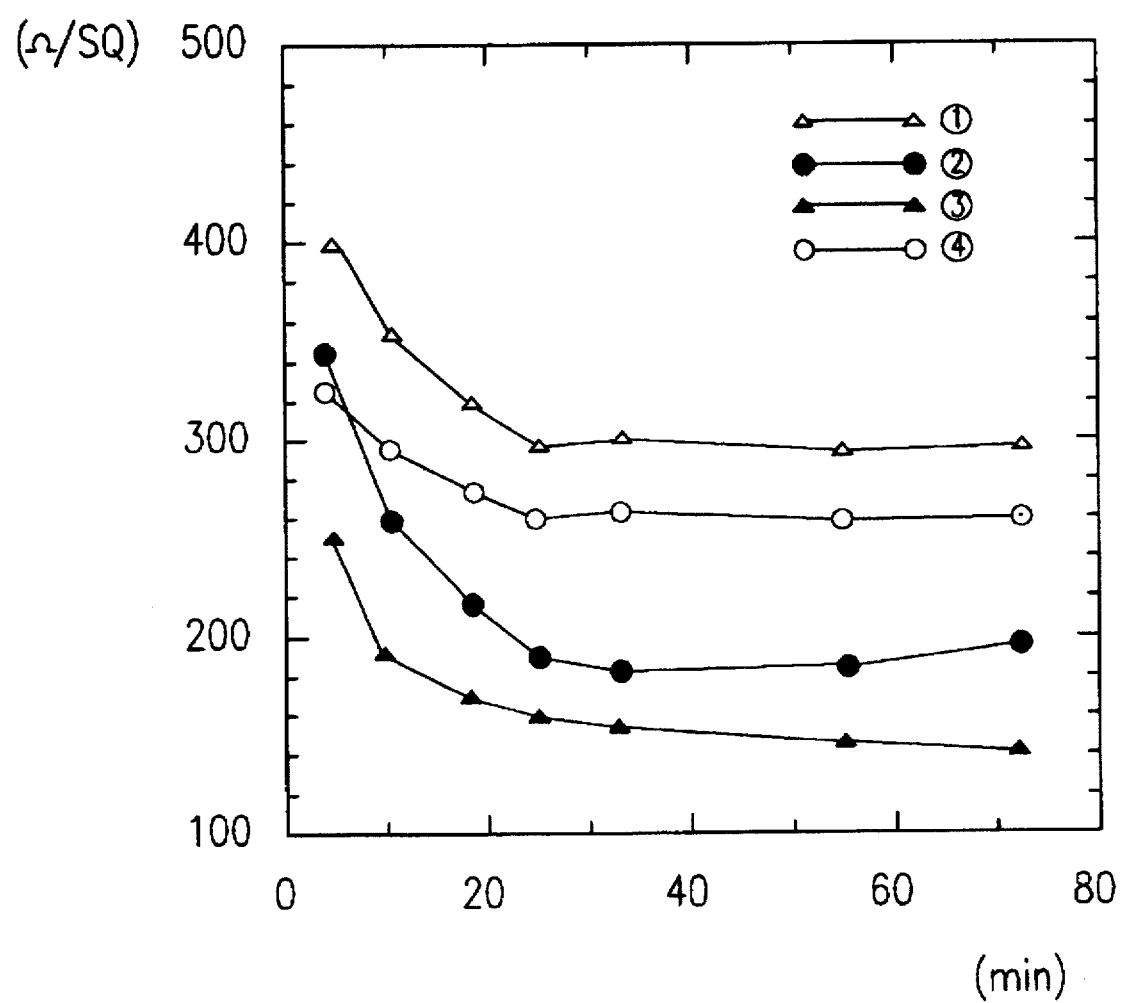
FIG. 4 is a graph showing the changes of face resistance with regard to the heat treatment time.

FIG. 4 shows the changes of face resistances according to thermal processing times in a variety of silicon films.

To begin with, the total thickness of the silicon thin film for gate is set 3,500 Å. Legend 1 denotes a first silicon thin film consisting of amorphous silicon and polysilicon which are deposited in a thickness of 2,500 and 1,000 Å, respectively. This is the case of the present invention. Legend 2 denotes a second silicon thin film consisting of only amorphous silicon which is deposited in a thickness of 3,500 Å. Legend 3 designates a third silicon thin film consisting of first polysilicon and second polysilicon which are deposited in a thickness of 2,500 and 1,000 Å, respectively, whereas the legend 4 indicates a fourth silicon thin film consisting of only polysilicon which is deposited in a thickness of 3,500 Å. Into these four silicon thin films, $BF_2^+$ ions are implanted at a dose of $4 \times 10^{15}$ $cm^{-2}$ ions/$cm^2$ and at an acceleration energy of 35 Kev. Thereafter, the silicon thin films are treated at 900° C. for 70 minutes.

Face resistance values are plotted with regard to the heat treatment time of 6 to 70 minutes and compared. As shown in FIG. 4, the first silicon thin film is superior to the other silicon thin films in face resistance, that is, conductivity.

Figure 5:
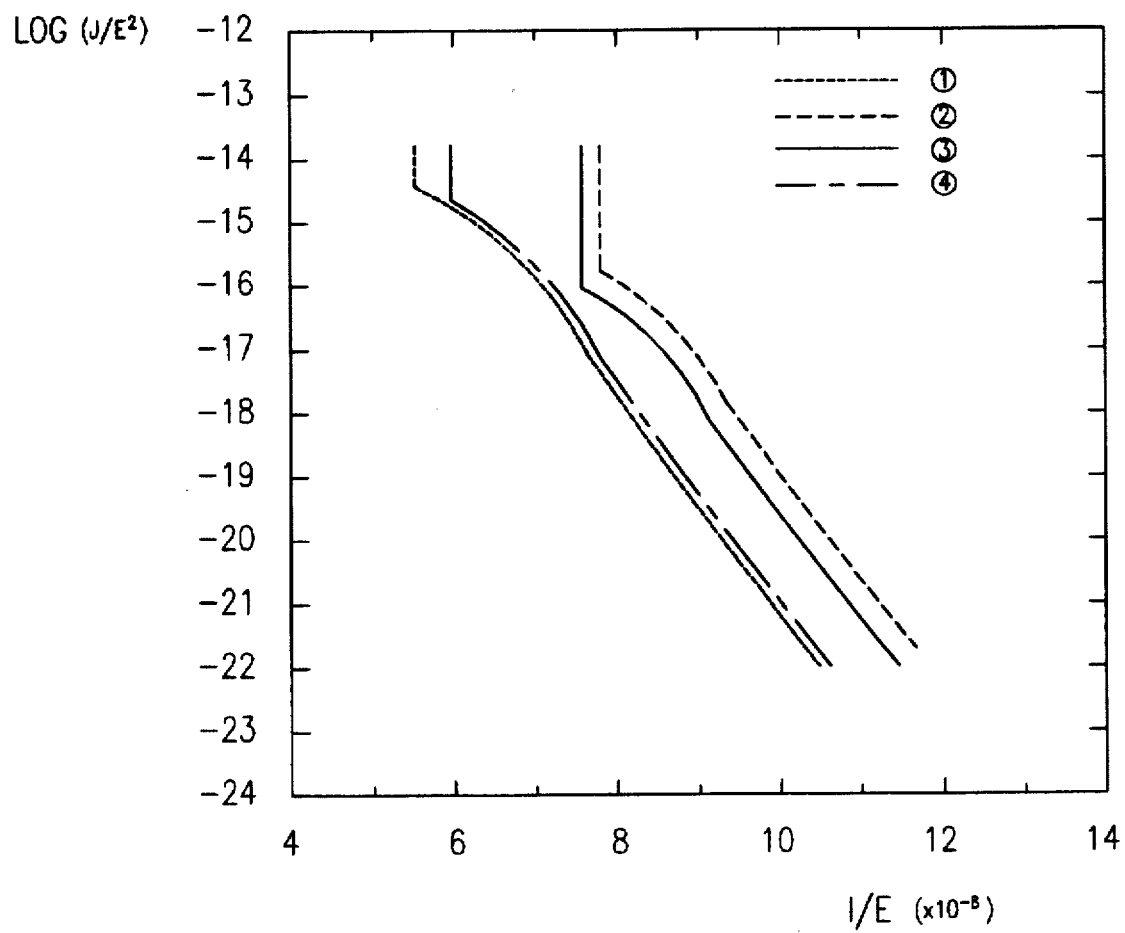
FIG. 5 is a graph showing relation of the I-V characteristics of silicides.
Figure 6A:
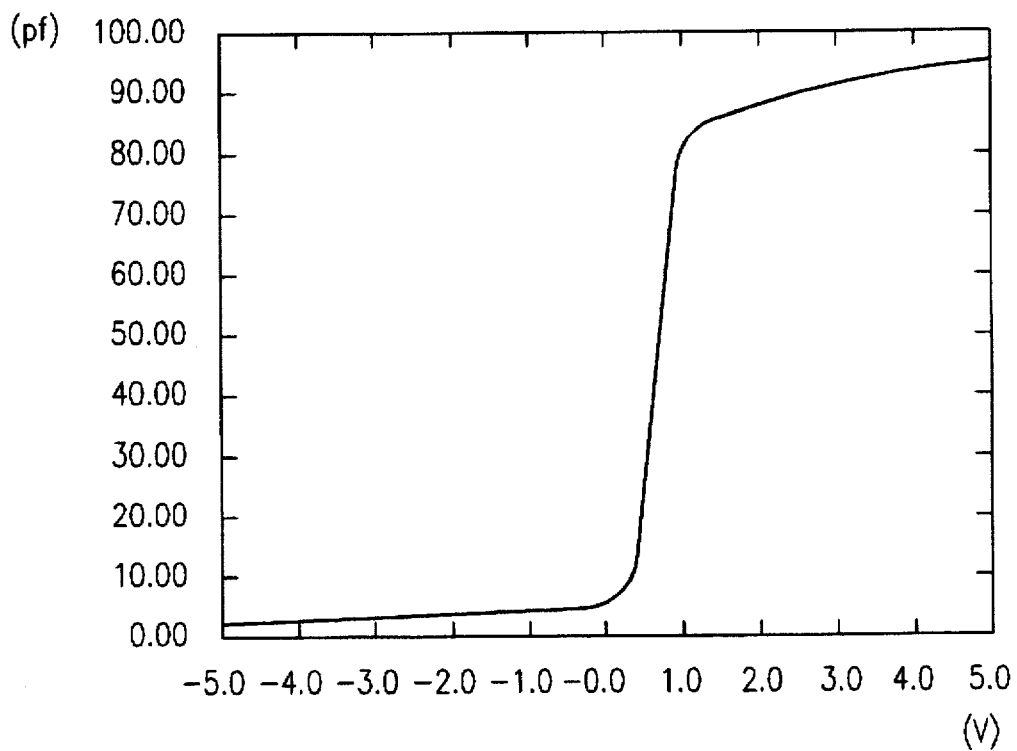
FIGS. 6A through 6D are graphs showing the C-V characteristics of silicides.
Figure 6B:
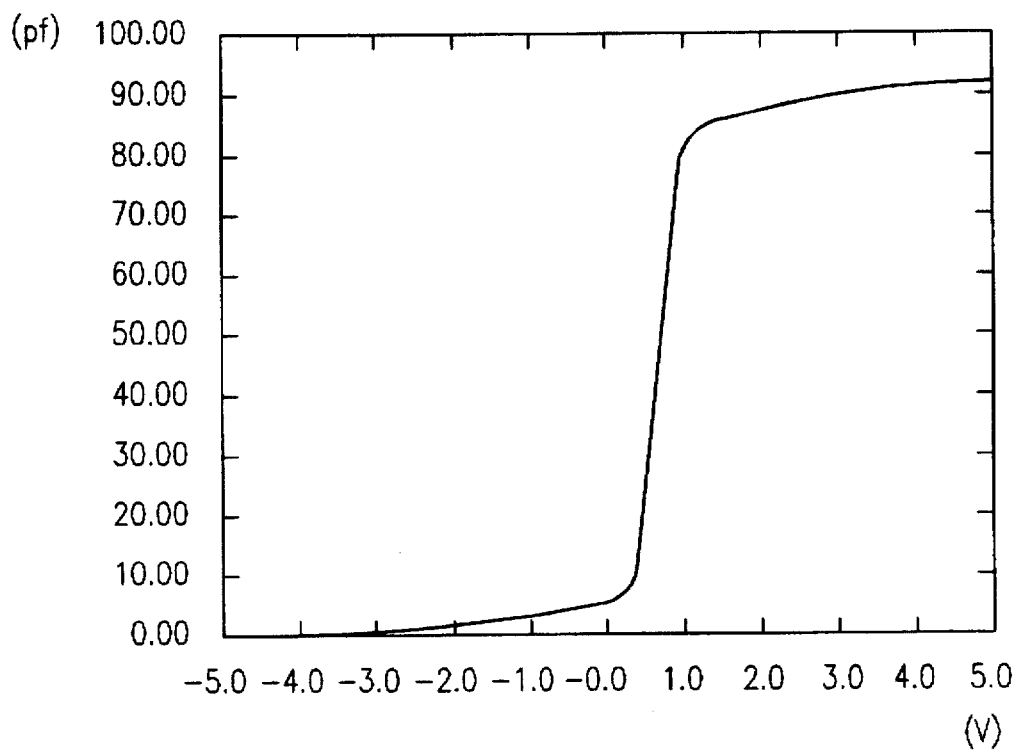
Figure 6C:
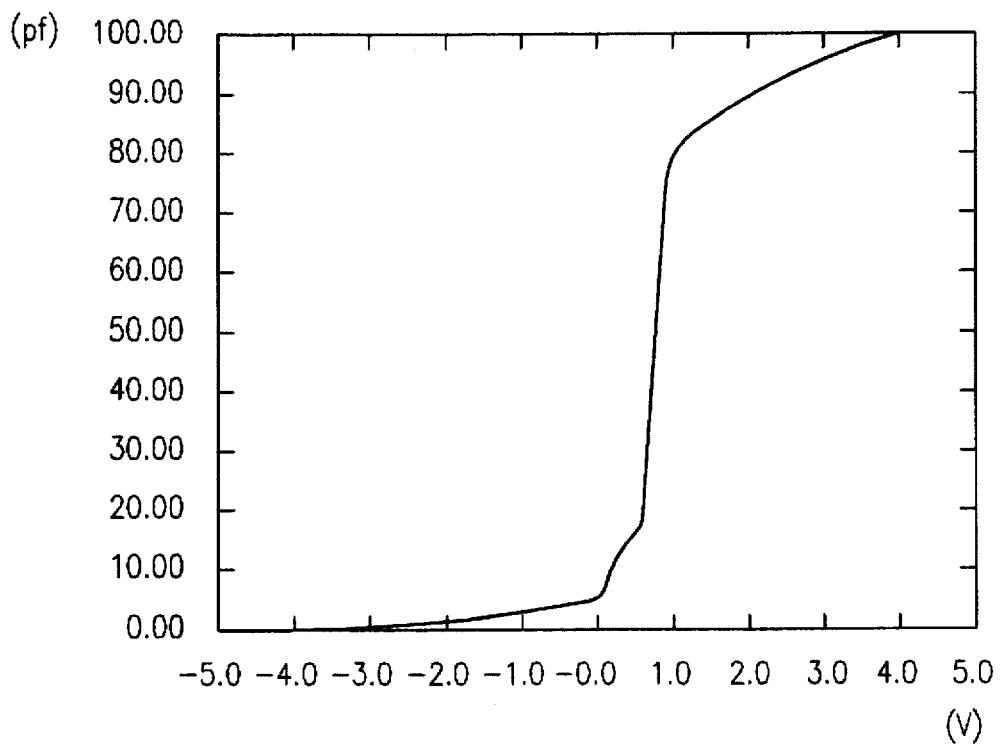
Figure 6D:
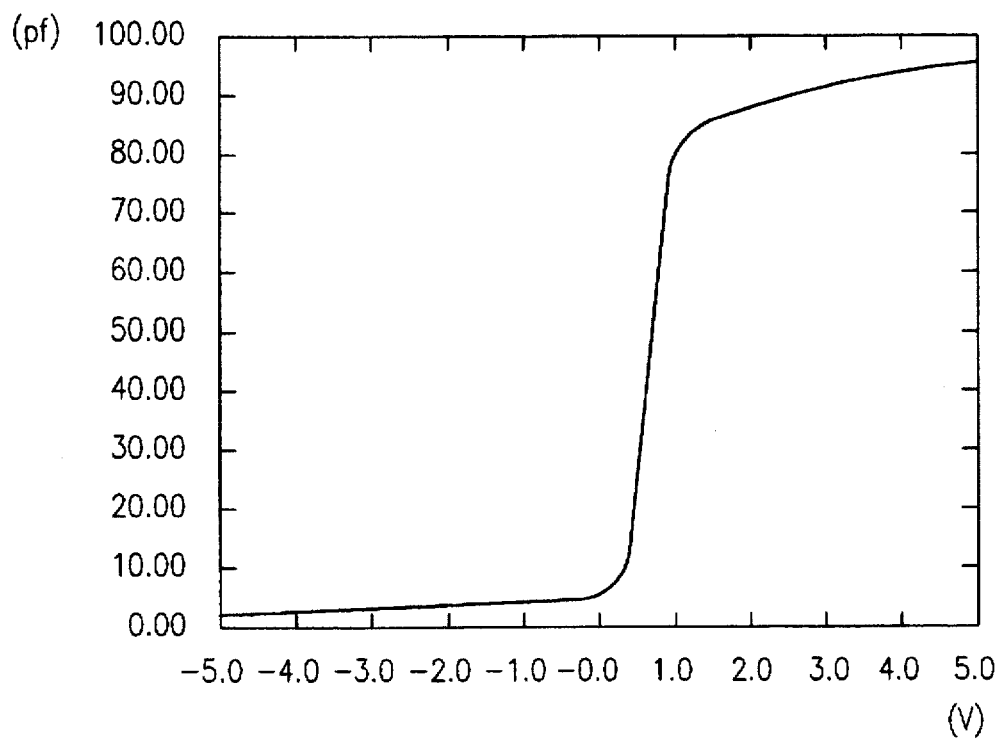

Referring now to FIG. 5, there are shown the I-V characteristics of a variety of $CoSi_2$ including the present invention.

To begin with, the total thickness of the silicon thin film for gate is set 3,500 Å. Legend 1 denotes first $CoSi_2$ which is formed by depositing amorphous silicon and polysilicon over a gate insulating film in a thickness of 2,500 and 1,000 Å, respectively, implanting $BF_2^{+into}$ the silicon thin film, treating with heat, depositing Co and carrying out another heat treatment. Legend 2 designates second $CoSi_2$ which is formed in a manner similar to that of the first $CoSi_2$ except that only amorphous silicon is deposited in a thickness of 3,500 Å instead of the amorphous silicon and polysilicon. Legend 3 indicates third $CoSi_2$ which is formed in a manner similar to that of the first $CoSi_2$ except that first polysilicon and second polysilicon are deposited in a thickness of 2,500 and 1,000 Å, respectively instead of the amorphous silicon and polysilicon, whereas legend 4 does fourth $CoSi_2$ formed in a manner similar to that of the first $CoSi_2$ except that only polysilicon is deposited in a thickness of 3,500 Å instead of the amorphous silicon and polysilicon.

The I-V characteristics of the four $CoSi_2$ are compared, showing that the first $CoSi_2$ has larger break down voltage and less leak current than the other $CoSi_2$.

Turning now into FIG. 6A through 6D, there are shown the C-V characteristics of a variety of $CoSi_2$ including the present invention.

To begin with, the total thickness of the silicon thin film for gate is set 3,500 Å. Legend 1 denotes first $CoSi_2$ which is formed by depositing amorphous silicon and polysilicon over a gate insulating film in a thickness of 2,500 and 1,000 Å, respectively, implanting $BF_2^{+into}$ the silicon thin film, treating with heat, depositing Co and carrying out another heat treatment. Legend 2 designates second $CoSi_2$ which is formed in a manner similar to that of the first $CoSi_2$ except that only amorphous silicon is deposited in a thickness of 3,500 Å instead of the amorphous silicon and polysilicon. Legend 3 indicates third $CoSi_2$ which is formed in a manner similar to that of the first $CoSi_2$ except that first polysilicon and second polysilicon are deposited in a thickness of 2,500 and 1,000 Å, respectively instead of the amorphous silicon and polysilicon, whereas legend 4 does fourth $CoSi_2$ formed in a manner similar to that of the first $CoSi_2$ except that only polysilicon is deposited in a thickness of 3,500 Å instead of the amorphous silicon and polysilicon.

The C-V characteristics of the four $CoSi_2$ are compared, showing that the first $CoSi_2$ is superior to the other $CoSi_2$ in electrical properties.

As described hereinbefore, the method according to the present invention is capable of preventing the degradation which is attributed to the penetration of impurities and thermal instability when forming a $P^+$ polygate. Accordingly, it can contribute to the improvement in electrical properties.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a semiconductor device, comprising the steps of:

(a) providing a semiconductor substrate having a gate insulating film thereon;

(b) forming an amorphous silicon layer about 2,500 angstroms thick on the gate insulating film;

(c) forming a polysilicon layer on the amorphous silicon layer, the polysilicon layer being thinner than the amorphous silicon layer;

(d) implanting impurity ions into the polysilicon layer such that a concentration of the impurity ions in the polysilicon layer is higher than a concentration of the impurity ions in the amorphous silicon layer, wherein the impurity ions are $BF_2$ ions;

(e) after step (d), conducting heat treatment on the semiconductor device, thereby forming vertical grain boundaries in the amorphous silicon layer and forming vertical grain boundaries in the polysilicon layer, wherein the vertical grain boundaries formed in the amorphous silicon layer are not connected with the vertical grain boundaries formed in the polysilicon layer; and then (f) forming a refractory metal layer on the polysilicon layer and then annealing the refractory metal layer to form a polycide.

2. The method of claim 1, wherein said annealing step forms the polycide on silicon of a gate electrode and the polycide reduces the resistance of the gate electrode.

3. The method of claim 1, wherein the polysilicon layer has a thickness such that the polysilicon layer is consumed when the polycide is formed during said annealing step.

4. The method of claim 1, wherein the metal of the refractory metal layer is cobalt.

5. The method of claim 1, wherein step (e) causes the implanted impurity ions to diffuse into the amorphous silicon layer and the polysilicon layer.

6. The method of claim 1, wherein the heat treatment of step (e) is done at about 900 degrees Celsius for about 70 minutes.

7. The method of claim 1, wherein the polysilicon layer is about 1,000 angstroms thick.

8. The method of claim 1, wherein the gate insulating film is about 80 angstroms thick.

* * * * *